(12) United States Patent
Park et al.

(10) Patent No.: US 10,115,845 B2
(45) Date of Patent: Oct. 30, 2018

(54) COMPOSITION FOR FORMING SOLAR CELL ELECTRODES AND ELECTRODES FABRICATED USING THE SAME

(71) Applicant: SAMSUNG SDI CO., LTD., Yongin-si, Gyeonggi-do (KR)

(72) Inventors: Sang Hee Park, Uiwang-si (KR); Min Su Park, Uiwang-si (KR); Tae Joon Kim, Uiwang-si (KR); Myung Sung Jung, Uiwang-si (KR); Hyun Jin Ha, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 58 days.

(21) Appl. No.: 15/305,378

(22) PCT Filed: Nov. 25, 2015

(86) PCT No.: PCT/KR2015/012733
§ 371 (c)(1),
(2) Date: Oct. 20, 2016

(87) PCT Pub. No.: WO2016/171359
PCT Pub. Date: Oct. 27, 2016

(65) Prior Publication Data
US 2017/0141247 A1    May 18, 2017

(30) Foreign Application Priority Data
Apr. 22, 2015 (KR) .......... 10-2015-0056794

(51) Int. Cl.
*H01L 31/0224* (2006.01)
*C03C 4/14* (2006.01)
*C03C 8/18* (2006.01)
*H01B 1/16* (2006.01)
*H01B 1/22* (2006.01)
(Continued)

(52) U.S. Cl.
CPC ........ *H01L 31/022425* (2013.01); *C03C 4/14* (2013.01); *C03C 8/16* (2013.01); *C03C 8/18* (2013.01); *C09D 5/24* (2013.01); *H01B 1/16* (2013.01); *H01B 1/22* (2013.01);
(Continued)

(58) Field of Classification Search
None
See application file for complete search history.

(56) References Cited

U.S. PATENT DOCUMENTS

2010/0252104 A1  10/2010  Fork et al.
2010/0323123 A1  12/2010  Akimoto
(Continued)

FOREIGN PATENT DOCUMENTS

KR   10-2007-0055489 A   5/2007
KR   10-2009-0110739 A   10/2009
(Continued)

OTHER PUBLICATIONS

Office Action dated Jan. 10, 2017 in the corresponding Taiwanese Patent Application No. 105106820.
(Continued)

*Primary Examiner* — Katie L Hammer
(74) *Attorney, Agent, or Firm* — Lee & Morse, P.C.

(57) ABSTRACT

The present invention relates to a composition for forming solar cell electrodes which includes a conductive powder, a glass frit and an organic vehicle, and has a tackiness of about 60% to about 90% represented by Expression 1.

11 Claims, 1 Drawing Sheet

(51) Int. Cl.
    *C09D 5/24* (2006.01)
    *C03C 8/16* (2006.01)
(52) U.S. Cl.
    CPC .. *H01L 31/022466* (2013.01); *C03C 2204/00* (2013.01); *C03C 2205/00* (2013.01); *Y02E 10/50* (2013.01)

(56) References Cited

U.S. PATENT DOCUMENTS

| | | |
|---|---|---|
| 2011/0272022 A1 | 11/2011 | Dan et al. |
| 2014/0124713 A1 | 5/2014 | Majumdar et al. |

FOREIGN PATENT DOCUMENTS

| | | |
|---|---|---|
| KR | 10-2010-0000685 A | 1/2010 |
| KR | 10-2010-0069950 A | 6/2010 |
| KR | 10-2011-0040713 A | 4/2011 |
| KR | 10-2014-0123204 A | 10/2014 |
| TW | 201425342 A | 7/2014 |
| TW | 201446970 A | 12/2014 |
| TW | 201505034 A | 2/2015 |
| TW | 201513135 A | 4/2015 |
| WO | WO 2011/046365 A2 | 4/2011 |
| WO | WO 2013/032092 A1 | 3/2013 |

OTHER PUBLICATIONS

Korean Office action dated May 25, 2017 in the corresponding Korean Patent Application No. 10-2015-0056794.

[Fig.1]
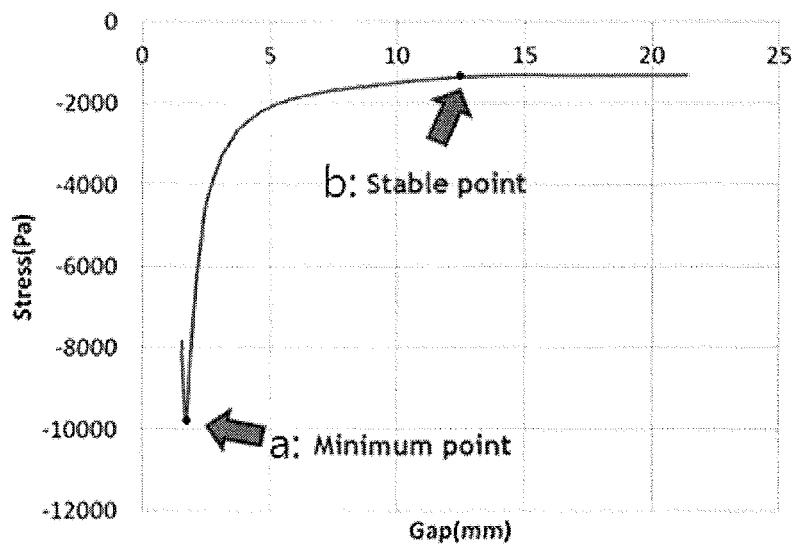
[Fig. 2]
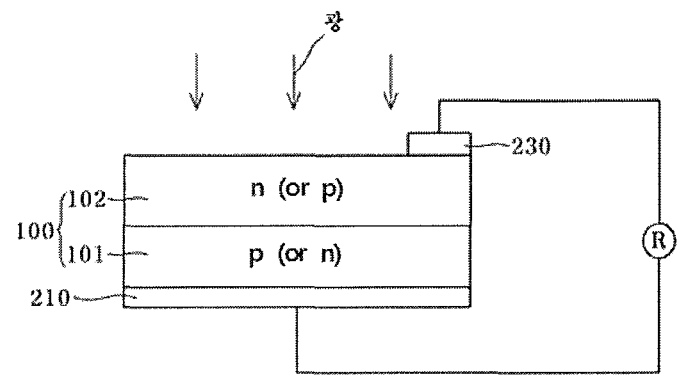

COMPOSITION FOR FORMING SOLAR CELL ELECTRODES AND ELECTRODES FABRICATED USING THE SAME

CROSS REFERENCE TO RELATED APPLICATIONS

This is the U.S. national phase application based on PCT Application No. PCT/KR2015/012733, filed Nov. 25, 2015, which is based on Korean Patent Application No. 10-2015-0056794, filed Apr. 22, 2015, the entire contents of all of which are hereby incorporated by reference.

BACKGROUND

1. Field of the Invention

The present invention relates to a composition for forming solar cell electrodes and solar cell electrodes fabricated using the same.

2. Discussion of Related Art

Solar cells generate electric energy using the photoelectric effect of a p-n junction which converts photons of sunlight into electricity. Front and rear electrodes are respectively formed on upper and lower surfaces of a semiconductor wafer or substrate with the p-n junctions in the solar cell. The photovoltaic effect at the p-n junction is induced by sunlight entering the semiconductor wafer, and electrons generated therefrom provide electric current flowing to the outside through the electrodes. The electrodes of the solar cell may be formed on the surfaces of the wafer by applying, patterning, and baking a composition for forming solar cell electrodes.

Methods of printing a composition for forming solar cell electrodes on the substrate may be largely classified into a gravure-offset printing method and a screen printing method. In the case of the gravure-offset printing method, the viscosity, drying properties and tackiness of the composition has a great influence, and in the case of the screen printing method, the rheological properties or thixotrophy of the composition is a large influence. Accordingly, it is important to use a composition for forming solar cell electrodes which may implement printed patterns with fine line widths and have a high aspect ratio when forming solar cell electrodes.

Korean Laid-Open Patent Publication No. 2011-0040713 discloses a method of controlling leveling properties and thixotropic properties of a composition for forming solar cell electrodes using a plasticizer to realize a narrow line width and a high aspect ratio. Korean Laid-Open Patent Publication No. 2010-0069950 discloses a technique of using a gravure-offset printing method in which a binder having a high glass transition temperature (Tg) is used as a second electrode to obtain a high aspect ratio, and Korean Laid-Open Patent Publication No. 2007-0055489 discloses a technique of improving a line width and aspect ratio by controlling thixotropic properties through a diameter of silver (Ag) powder. However, there is a limit to the above prior art for implementing fine line widths and high aspect ratio.

SUMMARY OF THE INVENTION

An objective of the present invention is to provide a composition for forming solar cell electrodes which may implement fine line widths.

Another objective of the present invention is to provide a composition for forming solar cell electrodes having excellent conversion efficiency.

Still another objective of the present invention is to provide a solar cell electrode including the composition for forming solar cell electrodes.

All the objectives of the present invention may be achieved by the present invention which will be described below.

An aspect of the present invention relates to a composition for forming solar cell electrodes including a conductive powder, a glass frit and an organic vehicle, and having a tackiness of about 60% to 90% represented by the following Expression 1.

$$\text{Tackiness}(\%) = \frac{A-B}{A} \times 100 \quad \text{[Expression 1]}$$

where A represents a minimum shear stress value of shear stress measured while detaching a pair of circular plates, from each other, which have a diameter of 25 mm and have been laminated in parallel to each other by a medium of the composition for forming solar cell electrodes, by applying an external force, and B represents a shear stress value at a point at which an instantaneous rate of change of shear stress with respect to a gap between the plates (d (shear stress)/d (gap)) is 0.05.

The composition may include the conductive powder of about 50 wt % to about 90 wt %; the glass fit of about 1 wt % to about 15 wt %; and the organic vehicle of about 5 wt % to about 40 wt %.

The composition may further include a surface tension modifier having surface tension of about 40 to about 65 mN/m.

The surface tension modifier may include one or more compounds selected from the group consisting of ethylene glycol, diethylene glycol, triethylene glycol, tetraethylene glycol, polyethylene glycol, 1,3-propanediol, 1,4-butanediol, 1,5-pentanediol, propylene carbonate, formamide, glycerol, and furfural.

The surface tension modifier may be included in amounts of about 0.1 to about 40 wt % of the composition for about solar cell electrodes.

The conductive powder may include one or more selected from the group consisting of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni) and indium tin oxide (ITO).

The glass frit may include a leaded glass frit, a lead-free glass frit or mixtures thereof.

The glass frit may have an average particle diameter D50 of about 0.1 to about 5 μm.

The composition may further include one or more selected from the group consisting of a dispersant, a plasticizer, a viscosity stabilizer, an anti-foaming agent, a pigment, a UV stabilizer, an antioxidant, and a coupling agent.

The composition may have the tackiness represented by Expression 1 may be in a range of about 65% to about 90%.

Another aspect of the present invention relates to a solar cell electrode fabricated using the composition for forming solar cell electrodes.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a graph showing shear stress values according to a gap, measured while detaching a pair of circular plates, from each other, which have a diameter of 25 mm and have been laminated in parallel to each other by a medium of the composition for forming solar cell electrodes, by applying an external force; and FIG. 2 is a concept view schematically illustrating a structure of a solar cell according to an example of the present invention.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Composition for Forming Solar Cell Electrodes

A composition for forming solar cell electrodes of the present invention may have a tackiness of about 60% to 90%, more specifically, about 65% to 90% represented by the following Expression 1:

$$\text{Tackiness}(\%) = \frac{A-B}{A} \times 100 \quad [\text{Expression 1}]$$

where A represents a minimum shear stress value of shear stress measured while detaching a pair of circular plates, from each other, which have a diameter of 25 mm and have been laminated in parallel to each other by a medium of the composition for forming solar cell electrodes, by applying an external force, and B represents a shear stress value at a point at which an instantaneous rate of change of shear stress with respect to a gap between the plates (d (shear stress)/d (gap)) is 0.05.

FIG. 1 illustrates a graph showing shear stress according to a gap, measured while detaching a pair of circular plates, from each other, which have a diameter of 25 mm and have been laminated in parallel to each other by a medium of the composition for forming solar cell electrodes, by applying an external force.

In the graph of FIG. 1, an x-axis represents a gap between the plates when detaching the circular plates from each other by the applied external force. A gap before applying the external force is a thickness of the composition for forming solar cell electrodes applied between the plates. A y-axis represents a shear stress value according to a gap. A plate used for measurement of the tackiness is stainless steel having a diameter of 25 mm and a thickness of 2 mm, and a content of the composition for forming solar cell electrodes supplied between the plates is 20 g. Further, a soak time is 10 seconds, a duration time is 20 seconds, a constant linear rate is 1.0 mm/s and a maximum gap change is 100 mm during the measurement of shear stress.

Further, the shear stress value was measured under conditions of a temperature of 25° C. and humidity of 20%.

In the graph of FIG. 1, the a point is a point at which detachment of the circular plates from each other is started, and a b point is a point at which an instantaneous rate of change of shear stress with respect to a gap is 0.05, which represents a time at which separation between the circular plates is substantially completed. After the b point, there is hardly any tail which is stretched from a composition layer between the plates, and almost no change in shear stress value.

According to the present invention, in Expression 1, A represents a shear stress value at the a point in the graph of FIG. 1, that is, the minimum shear stress value measured while detaching a pair of circular plates, from each other, which have been laminated by the composition for forming solar cell electrodes of the present invention, by applying an external force, and B represents a shear stress value at the b point in the graph of FIG. 1, that is, a shear stress value at a point at which an instantaneous rate of change of shear stress with respect to a gap between the plates (d (shear stress)/d (gap)) is 0.05.

When the tackiness represented by Expression 1 is in the range of about 60% to 90%, printing of fine patterns is possible and excellent conversion efficiency may be obtained. When the tackiness is less than about 60%, the degree of flooding on a printing mask may be reduced during printing, and when the tackiness is more than about 90%, pattern lines may be broken due to degradation in printability.

When the composition for forming solar cell electrodes of the present invention having the tackiness in the aforementioned range is printed on a substrate, especially, using a screen printing method, the line width of printed patterns may be in the range of about 65 to 90 μm, and line thickness may be in the range of about 15 to 25 μm. Further, an aspect ratio (line thickness/line width) which is the ratio of line thickness to line width of printed patterns may be about 0.15 or more, preferably in the range of about 0.15 to 0.50, and more preferably about 0.20 to 0.40. When the aspect ratio is in this range, an excellent printability may be obtained.

The composition for forming solar cell electrodes of the present invention includes a conductive powder A, a glass frit B and an organic vehicle C. Moreover, the composition may further include a surface tension modifier D, selectively. The composition may implement fine line widths during printing on a wafer substrate using a screen printing method, and a solar cell electrode fabricated using the composition has excellent conversion efficiency.

Hereinafter, each component forming a composition for forming solar cell electrodes will be described in detail.

(A) Conductive Powder

Either an organic material or inorganic material having conductivity may be used as the conductive powder used in the present invention. Preferably, silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni) or indium tin oxide (ITO) may be used. These conductive powders may be used alone or as a mixture of two or more thereof. The conductive powder preferably includes silver (Ag) particles, and may further include nickel (Ni), cobalt (Co), iron (Fe), zinc (Zn) or copper (Cu) particles besides the silver (Ag) particles.

The conductive powder may have an average particle diameter D50 of about 0.1 to 10 μm, preferably about 0.2 to 7 μm, and more preferably about 0.5 to 5 μm.

The conductive powder may be included in amounts of about 50 to 90 wt %, and preferably in amounts of about 70 to 90 wt % based on the total weight of the composition. In this range, a decrease in conversion rate due to an increase in resistance may be prevented, difficulty in forming a paste due to a relative decrease in an amount of the organic vehicle may be removed, and suitable dispersibility, fluidity and printability may be obtained.

(B) Glass Frit

The glass frit functions to form crystal grains of silver powder in an emitter region by etching an anti-reflective layer and melting the silver powder to reduce resistance during the baking process of the electrode paste, improve adhesion between the conductive powder and the wafer, and decrease the baking temperature by softening during the baking process.

When the surface area of the solar cell is increased to improve solar cell efficiency, contact resistance of the solar cell may increase, and thus, it is required to minimize serial resistance as well as influence on the p-n junction. Further, since a temperature range for baking is widened with increasing use of wafers having various surface resistances, it is preferable to use the glass frit which may ensure sufficient thermal stability at a wide range of baking temperatures.

One or more of a leaded glass frit or a lead-free glass generally used for a composition for forming solar cell electrodes may be used as the glass frit.

The glass frit may include one or a mixture of metal oxides selected from the group consisting of lead oxide, silicon oxide, tellurium oxide, bismuth oxide, zinc oxide, boron oxide, aluminum oxide, tungsten oxide, etc. For example, a zinc oxide-silicon oxide ($ZnO$—$SiO_2$)-based, zinc oxide-boron oxide-silicon oxide ($ZnO$—$B_2O_3$—$SiO_2$)-based, zinc oxide-boron oxide-silicon oxide-aluminum oxide ($ZnO$—$B_2O_3$—$SiO_2$—$Al_2O_3$)-based, bismuth oxide-silicon oxide ($Bi_2O_3$—$SiO_2$)-based, bismuth oxide-boron oxide-silicon oxide ($Bi_2O_3$—$B_2O_3$—$SiO_2$)-based, bismuth oxide-boron oxide-silicon oxide-aluminum oxide ($Bi_2O_3$—$B_2O_3$—$SiO_2$—$Al_2O_3$)-based, bismuth oxide-zinc oxide-boron oxide-silicon oxide ($Bi_2O_3$—$ZnO$—$B_2O_3$—$SiO_2$)-based, or bismuth oxide-zinc oxide-boron oxide-silicon oxide-aluminum oxide ($Bi_2O_3$—$ZnO$—$B_2O_3$—$SiO_2$—$Al_2O_3$)-based glass frit or the like may be used.

The glass frit may be prepared from the aforementioned metal oxides using a common method. For example, compositions of the aforementioned metal oxides are mixed. Mixing is performed using a ball mill or a planetary mill. The mixed composition is melted under conditions of about 900 to 1300° C., and is quenched at about 25° C. The obtained product is ground by a disk mill, a planetary mill or the like, and thereby the glass fit may be obtained.

The shape of the glass frit is not particularly limited, and for example, may be a spherical or irregular shape.

The glass fit may have an average particle diameter D50 of about 0.1 to 5 μm.

As the glass frit, a commonly used commercial glass frit may be purchased to be used, or for example, a glass frit prepared by selectively melting silicon dioxide ($SiO_2$), aluminum oxide ($Al_2O_3$), boron oxide ($B_2O_3$), bismuth oxide ($Bi_2O_3$), sodium oxide ($Na_2O$), zinc oxide ($ZnO$) or the like to obtain a desired composition may be used.

The glass fit may be included in amounts of about 1 to 15 wt %, preferably, in amounts of about 2 to 10 wt % based on the total weight of the composition. In this range, suitable dispersibility, fluidity and printability may be obtained.

(C) Organic Vehicle

The organic vehicle provides viscosity and rheological properties suitable for printing to the composition for forming solar cell electrodes by mechanical mixing with inorganic components of the composition.

An organic vehicle commonly used for the composition for forming solar cell electrodes may be used as the organic vehicle, and the organic vehicle may include a commonly-used binder resin, solvent, etc.

An acrylate-based resin, a cellulose-based resin or the like may be used as the binder resin, and ethyl cellulose is a generally used resin. However, ethyl hydroxyethyl cellulose, nitrocellulose, a mixture of ethyl cellulose and a phenolic resin, an alkyd resin, a phenolic resin, an acrylic acid ester-based resin, a xylene-based resin, a polybutene-based resin, a polyester-based resin, a urea-based resin, a melamine-based resin, a vinyl acetate-based resin, wood rosin, a polymethacrylate of alcohol or the like may also be used.

Examples of the solvent include one or a mixture of two or more of hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methyl ethyl ketone, benzyl alcohol, gamma butyrolactone, ethyl lactate, etc.

The organic vehicle may be included in amounts of about 5 to 40 wt % based on the total weight of the composition for forming solar cell electrodes. In this range, a sufficient adhesive strength and excellent printability may be ensured.

(D) Surface Tension Modifier

The composition of the present invention may further include a surface tension modifier. In the present invention, the surface tension modifier refers to a co-solvent having a surface tension of about 40 mN/m or more, for example about 40 to 65 mN/m at 20° C. The surface tension in the present invention may refer to a surface tension value measured at 20° C. according to ASTM D 1331 standard.

As an example, the surface tension modifier may include ethylene glycol, diethylene glycol, triethylene glycol, tetraethylene glycol, polyethylene glycol, 1,3-propanediol, 1,4-butanediol, 1,5-pentanediol, propylene carbonate, formamide, glycerol, furfural, etc. These may be used alone or as a mixture of two or more thereof.

The surface tension modifier may be included in amounts of about 0.1 to 40 wt %, preferably in amounts of about 0.1 to 25 wt % based on the total weight of the composition for forming solar cell electrodes. In this range, suitable fluidity and printability may be obtained.

(E) Other Additives

The composition for forming solar cell electrodes of the present invention may further include general additives besides the components described above to improve flowability, processability and stability, as necessary. One or a mixture of two or more of dispersants, plasticizers, viscosity stabilizers, anti-foaming agents, pigments, UV stabilizers, antioxidants, coupling agents and the like may be used as the additives. These additives may be included in amounts of about 0.1 to 5 wt % based on the total weight of the composition for forming solar cell electrodes, but the content of the additives may be modified as necessary.

Solar Cell Electrode and Solar Cell Including the Same

Another aspect of the present invention relates to an electrode formed from the composition for forming solar cell electrodes and a solar cell including the same. FIG. 2 illustrates a structure of a solar cell according to an example of the present invention.

Referring to FIG. 2, a rear electrode 210 and a front electrode 230 may be formed by printing the composition for electrodes on a wafer 100 or substrate including a p-layer (or n-layer) 101 and an n-layer (or p-layer) 102 as an emitter and baking the composition. For example, a preliminary process of the rear electrode may be performed by print coating the composition for electrodes on the rear surface of the wafer, and drying the composition at about 200 to 400° C. for about 10 to 60 seconds. Further, a preliminary process of the front electrode may be performed by printing the composition for electrodes on the front surface of the wafer, and drying the composition. Thereafter, the front electrode and rear electrode may be formed by performing the baking process at about 400 to 950° C., preferably about 750 to 950° C. for 30 to 50 seconds.

The present invention will be described in detail in conjunction with examples, but it should be understood that these examples are provided for illustration only and are not to be construed in any way as limiting the present invention.

EXAMPLE 1

1.5 wt % of ethyl cellulose (STD4 and SDT200, The Dow Chemical Company) as an organic binder was sufficiently mixed in 6.2 wt % of butylcarbitol (The Dow Chemical Company) as a solvent at 60° C. to prepare an organic vehicle, 85 wt % of a spherical silver powder (AG-4-8, Dowa Hightech Co., Ltd.) having an average particle diameter of 2.0 μm, 3 wt % of a glass frit (CI-124, BASS Co., Ltd.) having an average particle diameter of 1.0 μm, 0.3 wt % of tetraethylene glycol (Sigma-Aldrich Corporation) and 0.6 wt % of formamide (Sigma-Aldrich Corporation) as surface tension modifiers, 0.2 wt % of a dispersant (BYK102, BYK-Chemie GmbH), 0.3 wt % of a thixotropic agent (Thixatrol ST, Elementis Co., Ltd.) and 2.9 wt % of dimethyl adipate (Sigma-Aldrich Corporation) which is a plasticizer as additives were put into the organic vehicle, and thoroughly mixed, followed by mixing and kneading in a 3-roll kneader, thereby a composition for forming solar cell electrodes was prepared.

EXAMPLES 2 to 6 AND COMPARATIVE EXAMPLE 1

Compositions for solar cell electrodes were prepared in the same manner as in Example 1 except that each component was included as in Table 1.

Method for Measuring Physical Properties (1) Measurement of Tackiness

Under conditions of a temperature of 25° C. and humidity of 20%, a pair of circular plates (stainless steel having a diameter of 25 mm and a thickness of 2 mm) were laminated by a medium of 20 g of the composition for forming solar cell electrodes prepared according to Examples 1 to 6 and Comparative Example 1, a shear stress value was measured while detaching the circular plates from each other by an applied external force, and tackiness was measured by substituting the shear stress value in the following Expression 1. The results were shown in Table 1.

$$\text{Tackiness}(\%) = \frac{A - B}{A} \times 100 \qquad \text{[Expression 1]}$$

where A represents the minimum shear stress value, and B represents a shear stress value at a point at which an instantaneous rate of change of shear stress with respect to a gap between the plates (d(shear stress)/d(gap)) is 0.05.

(2) Measurement of Short-circuit Current and Conversion Efficiency

The composition for forming solar cell electrodes prepared in Examples 1 to 6 and Comparative Example 1 was printed on the front surface of a monocrystalline wafer by a screen printing method, and dried using an infrared drying oven. Cells prepared by the process were baked at 600 to 900° C. for 60 to 210 seconds using a belt-type baking oven to prepare cells. The short-circuit current (Isc) and conversion efficiency (%) of the solar cell were measured using a solar cell efficiency tester (CT-801, Pasan Co., Ltd.) for the prepared cells, and the results were shown in Table 1.

(3) Measurement of Line Width and Thickness

The composition for forming solar cell electrodes prepared in Examples 1 to 6 and Comparative Example 1 was screen-printed in a uniform pattern on the front surface of the wafer using a screen mask designed to have a line width of about 30 to 50 μm. The line width and thickness of an electrode (finger bar) prepared after drying and baking the printed wafer were measured using VK equipment (VK9710, KEYENCE Co., Ltd.), and the results are shown in the following Table 1.

TABLE 1

| | | Example | | | | | | Comparative |
|---|---|---|---|---|---|---|---|---|
| | | 1 | 2 | 3 | 4 | 5 | 6 | Example 1 |
| (A) conductive powder | | 85.0 | 85.0 | 85.0 | 85.0 | 85.0 | 85.0 | 85.0 |
| (B) glass frit | | 3.0 | 3.0 | 3.0 | 3.0 | 3.0 | 3.0 | 3.0 |
| (C) organic vehicle | Organic binder | 1.5 | 1.5 | 1.5 | 1.2 | 1.0 | 1.5 | 2.0 |
| | Solvent | 6.2 | 6.2 | 6.2 | 5.9 | 5.9 | 6.2 | 6.2 |
| (D) surface tension modifier | (d1) ethylene glycol | | 0.6 | | | | 0.1 | |
| | (d2) diethylene glycol | | | 0.3 | | 0.7 | | |
| | (d3) triethylene glycol | | | | | 0.7 | | 0.1 |
| | (d4) tetraethylene glycol | 0.3 | | | | | 0.2 | |
| | (d5) polyethylene glycol | | | | 0.4 | | | |

TABLE 1-continued

|  | Example | | | | | | Comparative |
| --- | --- | --- | --- | --- | --- | --- | --- |
|  | 1 | 2 | 3 | 4 | 5 | 6 | Example 1 |
| (d6) 1,3-propanediol |  |  |  |  | 0.7 |  |  |
| (d7) 1,4-butanediol, |  | 0.5 |  |  |  |  |  |
| (d8) 1,5-pentanediol |  |  | 0.3 |  |  | 0.8 |  |
| (d9) formamide | 0.6 |  |  |  | 0.5 |  |  |
| (d10) glycerol |  |  |  | 0.3 |  |  |  |
| (E) additive | 3.4 | 3.2 | 3.7 | 3.5 | 3.2 | 3.2 | 3.7 |
| Tackiness | 81 | 82 | 80 | 75 | 71 | 68 | 92 |
| Line width (μm) | 71.5 | 72.2 | 72.0 | 71.2 | 71.2 | 70.9 | 85.0 |
| Thickness (μm) | 18.5 | 18.5 | 18.4 | 18.6 | 18.9 | 19.1 | 17.2 |
| Short-circuit current [A] | 9.10 | 9.09 | 9.09 | 9.12 | 9.10 | 9.12 | 8.97 |
| Conversion efficiency [%] | 19.05 | 19.02 | 19.03 | 19.07 | 19.06 | 19.08 | 18.71 |

[unit: wt %]

Referring to the results in Table 1, it may be determined that compositions for solar cell electrodes of Examples 1 to 6 in which the tackiness calculated by Expression 1 is in the range of about 60 to 90% have an excellent printability for the formation of fine patterns, and solar cell electrodes fabricated using them have superior conversion efficiency.

The composition for forming solar cell electrodes of the present invention can implement printed patterns with fine line widths, and has excellent conversion efficiency.

Simple modifications and alterations of the invention can be easily performed by those skilled in the art, and all the modifications and alterations fall within the scope of the invention.

What is claimed is:

1. A composition for forming solar cell electrodes, the composition comprising a conductive powder, a glass frit, an organic vehicle, and a surface tension modifier having a surface tension of 40 to 60 mN/m, the composition for forming solar cell electrodes having a tackiness of 60% to 90% represented by the following Expression 1:

$$\text{Tackiness}(\%) = \frac{A - B}{A} \times 100 \quad [\text{Expression 1}]$$

wherein, in Expression 1, A represents a minimum shear stress value of shear stress measured while detaching a pair of circular plates, from each other, which have a diameter of 25 mm and have been laminated in parallel to each other by a medium of the composition for forming solar cell electrodes, by applying an external force, and B represents a shear stress value at a point at which an instantaneous rate of change of shear stress with respect to a gap between the plates (d (shear stress)/d (gap)) is 0.05.

2. The composition of claim 1, wherein the composition includes:
   50 wt % to 90 wt % of the conductive powder;
   1 wt % to 15 wt % of the glass frit;
   0.1 to 40 wt % of the surface tension modifier; and
   5 wt % to 40 wt % of the organic vehicle.

3. The composition of claim 1, wherein the surface tension modifier includes one or more of ethylene glycol, diethylene glycol, triethylene glycol, tetraethylene glycol, polyethylene glycol, 1,3-propanediol, 1,4-butanediol, 1,5-pentanediol, propylene carbonate, formamide, glycerol, and furfural.

4. The composition of claim 1, wherein the conductive powder includes one or more of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO).

5. The composition of claim 1, wherein the glass frit includes a leaded glass frit, a lead-free glass frit or mixtures thereof.

6. The composition of claim 1, wherein the glass fit has an average particle diameter D50 of 0.1 to 5 μm.

7. The composition of claim 1, further comprising one or more of a dispersant, a plasticizer, a viscosity stabilizer, an anti-foaming agent, a pigment, a UV stabilizer, an antioxidant, and a coupling agent.

8. The composition of claim 1, wherein the tackiness represented by Expression 1 is in a range of 65% to 90%.

9. A solar cell electrode fabricated using the composition of claim 1.

10. The composition of claim 1, to wherein the organic vehicle is a solvent and the solvent includes hexane, toluene, ethyl cellosolve, cyclohexanone, butyl cellosolve, diethylene glycol monobutyl ether, diethylene glycol dibutyl ether, diethylene glycol monobutyl ether acetate, propylene glycol monomethyl ether, hexylene glycol, terpineol, methyl ethyl ketone, benzyl alcohol, gamma butyrolactone, or ethyl lactate.

11. The composition of claim 1, wherein the surface tension modifier is included in the composition in an amount of 0.1 wt % to less than 1 wt %.

* * * * *